(12) United States Patent
Jiang et al.

(10) Patent No.: US 7,656,706 B2
(45) Date of Patent: Feb. 2, 2010

(54) STORING INFORMATION IN A MEMORY

(75) Inventors: Anxiao Jiang, College Station, TX (US);
Vasken Z. Bohossian, Montreal (CA);
Jehoshua Bruck, La Canada, CA (US)

(73) Assignees: The Texas A&M University System,
College Station, TX (US); California Institute of Technology, Pasadena, CA (US)

( * ) Notice: Subject to any disclaimer, the term of this patent is extended or adjusted under 35 U.S.C. 154(b) by 202 days.

(21) Appl. No.: 11/969,845

(22) Filed: Jan. 4, 2008

(65) Prior Publication Data

US 2008/0170447 A1 Jul. 17, 2008

Related U.S. Application Data

(60) Provisional application No. 60/878,984, filed on Jan. 5, 2007.

(51) Int. Cl.
*G11C 11/34* (2006.01)
(52) U.S. Cl. .............................. 365/185.03; 365/185.01; 365/189.011
(58) Field of Classification Search ............ 365/185.03, 365/185.01, 189.011
See application file for complete search history.

(56) References Cited

U.S. PATENT DOCUMENTS 6,577,530 B2 * 6/2003 Muranaka et al. ........... 365/177

| | | | |
|---|---|---|---|
| 6,794,997 B2 | 9/2004 | Sprouse | |
| 2002/0157059 A1 | 10/2002 | Gregori et al. | |
| 2003/0018861 A1 | 1/2003 | Micheloni et al. | |
| 2005/0111287 A1 | 5/2005 | Du et al. | |

OTHER PUBLICATIONS

Notification of Transmittal of the International Search Report and the Written Opinion of the International Searching Authority, or the Declaration (3 pages), Written Opinion of the International Searching Authority (4 pages), and International Search Report (3 pages) for International Application No. PCT/US2008/050313 mailed Jun. 10, 2008.
Notification of Transmittal of the International Search Report and the Written Opinion of the International Search Authority, or the Declaration (3 pages), Written Opinion of the International Searching Authority (4 pages), and International Search Report (3 pages) for International Application No. PCT/US2008/050311 mailed Jun. 10, 2008.

(Continued)

*Primary Examiner*—Son Dinh
*Assistant Examiner*—Nam Nguyen
(74) *Attorney, Agent, or Firm*—Fish & Richardson P.C.

(57) ABSTRACT

Systems and methods, including computer software products, can be used to update or modify data stored in a memory. One or more variables are represented with one or more cell values in a memory. Each variable is associated with one or more of the cell values. Multiple states of the one or more variables are defined, and each defined state of the one or more variables includes a current store value for each variable and at least one previous store value for the variable. One or more single cell values influence the current store value and previous store value of at least one variable.

24 Claims, 3 Drawing Sheets

OTHER PUBLICATIONS

Notification Concerning Transmittal Of International Preliminary Report On Patentability (1 page); International Preliminary Report On Patentability (1 page); Written Opinion Of The International Searching Authority (4 pages); all mailed on Jul. 16, 2009 in PCT International Patent Application No. PCT/US2008/050313. (Total 6 pages).

Notification Concerning Transmittal Of International Preliminary Report On Patentability (1 page); International Preliminary Report On Patentability (1 page); Written Opinion Of The International Searching Authority (4 pages); all mailed on Jul. 16, 2009 in PCT International Patent Application No. PCT/US2008/050311. (Total 6 pages).

Anxiao (Andrew) Jiang, et al., "*Floating Codes for Joint Information Storage in Write Asymmetric Memories,*" Proc. IEEE International Symposium on Information Theory (ISIT), Jun. 2007, 5 pages.

Vasken Bohossian, et al., "*Buffer Coding for Asymmetric Multi-Level Memory,*" Proc. IEEE International Symposium on Information Theory (ISIT'07), Jun. 2007, 5 pages.

Anxiao (Andrew) Jiang, "*On The Generalization of Error-Correcting WOM Codes,*" Proc. IEEE International Symposium on Information Theory (ISIT'07), Jun. 2007, 5 pages.

Anxiao (Andrew) Jiang, et al., "*Joint Coding for Flash Memory Storage,*" submitted to IEEE International Symposium on Information Theory (ISIT'08), Jan. 2008, 9 pages.

Gerard D. Cohen, et al., "*Linear Binary Code for Write-Once Memories,*" IEEE Transactions on Information Theory, vol. IT-32, No. 5, Sep. 1986, pp. 697-700.

Amos Fiat, et al., "*Generalized 'Write-Once' Memories,*" IEEE Transactions on Information Theory, vol. IT-30, No. 3, May 1984, pp. 470-480.

Fang-Wei Fu, et al., "*On the Capacity of Generalized Write-Once Memory with State Transitions Described by an Arbitrary Directed Acyclic Graph,*" IEEE Transactions on Information Theory, vol. 45, No. 1, Jan. 1999, pp. 308-313.

Stefano Gregori, et al., "*On-Chip Error Correcting Techniques for New-generation Flash Memories,*" Proceedings of the IEEE, vol. 91, No. 4, Apr. 2003, pp. 602-616.

Chris Heegard, "*On the Capacity of Permanent Memory,*" IEEE Transactions on Information Theory, vol. IT-31, No. 1, Jan. 1985, pp. 34-42.

Alexander V. Kuznetsov, et al., "*On the General Defective Channel with Informed Encoder and Capacities of Some Constrained Memories,*" IEEE Transactions on Information Theory, vol. 40, No. 6, Nov. 1994, pp. 1866-1871.

Frans Merkx, "*WOMcodes Constructed with Projective Geometries,*" Traitement du Signal, vol. 1, No. 2-2, 1984, pp. 227-231.

Ronald L. Rivest, et al., "*How to Reuse a 'Write-Once' Memory,*" Information and Control, vol. 55, 1982, pp. 105-113.

J.K. Wolf, et al., "*Coding for a Write-Once Memory,*" AT&T Bell Laboratories Technical Journal, vol. 63, No. 6, Jul.-Aug. 1984, pp. 1089-1112.

Fang-Wei Fu, et al., "*On the Capacity and Error-Correcting Codes of Write-Efficient Memories,*" IEEE Transactions on Information Theory, vol. 46, No. 7, Nov. 2000, pp. 2299-2314.

G. Zemor, et al., "*Error-Correcting WOM-Codes,*" IEEE Transactions on Information Theory, vol. 37, No. 3, May 1991, pp. 730-734.

G. Cohen, et al., Covering Codes, Chapter 5, Section 5.1, "*Basic Facts About Linear Covering Codes,*", North-Holland, 1997, pp. 120-126, 128 and 141.

\* cited by examiner

| Cell State Vector | 0 | 1 | 2 | 3 | 4 | 5 |
|---|---|---|---|---|---|---|
| Variable Vector | (0,0,0) | (0,0,1) | (0,1,1) | (0,1,0) | (1,1,1) | (1,1,0) |

| Cell State Vector | 6 | 7 | 8 | 9 | 10 | 11 |
|---|---|---|---|---|---|---|
| Variable Vector | (1,0,0) | (1,0,1) | (0,0,0) | (0,0,1) | (0,1,1) | (0,1,0) |

US 7,656,706 B2

STORING INFORMATION IN A MEMORY

CROSS-REFERENCE TO RELATED APPLICATIONS

This application is related to and claims the benefit of co-pending provisional application Ser. No. 60/878,984, filed Jan. 5, 2007, which is incorporated herein by reference.

BACKGROUND

This disclosure relates to storing information in a memory. Some memories include storage cells that transit asymmetrically among states. For example, flash memories may store information in the states of floating-gate cells. The state of a floating-gate cell may depend on the amount of charge trapped in the cell, and writing information to a flash memory may include injecting charge into one or more of the floating-gate cells (e.g. by the hot-electron injection mechanism or the Fowler-Nordheim tunneling mechanism). Rewriting information to the flash memory may include erasing all of the information stored in a collection (e.g. a block) of floating-gate cells.

SUMMARY

In one general aspect, one or more variables are represented with one or more cell values in a memory. Each variable is associated with one or more of the cell values. Multiple states of the one or more variables are defined, and each state of the one or more variables includes a current store value for each variable and one or more previous store values for the variable. One or more single cell values influence the current store value and previous store value of at least one of the variables.

Implementations may include one or more of the following features. One or more first cell values can be written to one or more cells of a memory. Each of the cells can have multiple possible cell states sequentially ordered from a lowest cell state to a highest cell state. Each of the first cell values can correspond to one of the possible cell states. The one or more first cell values can jointly represent multiple first store values of a variable. The multiple first store values can be a first store value of the variable and one or more previous store values of the variable. One or more of the first cell values can be an individual cell value based at least in part on more than one of the multiple first store values.

One or more second cell values can be written to the cells. Each of the second cell values can correspond to one of the possible cell states. Each of the cells can either remain in its previous cell state or progress to a cell state higher than its previous cell state. The second cell values can jointly represent multiple second store values of a variable, the second plurality of store values can be a new store value of the variable and one or more previous store values of the variable.

The multiple second store values of the variable can include the first store value of the variable. The multiple first store values and the multiple second store values can each include two store values, where the one or more previous store values is a most recent store value of the variable. The multiple second store values can include at least one of the one or more previous store values of the variable included in the multiple first store values.

The multiple first store values and the multiple second store values can each include r store values. The value of r can be greater than one. The multiple second store values can include r−1 of the multiple first store values. The second cell values can be determined based at least in part on an algorithm. The algorithm can have inputs that include the second store value of the variable.

The multiple cells of the memory can be n cells. The variable can have two possible store values. Each of the multiple first store values and each of the multiple second store values can correspond to one of the two possible store values. Each of the cells can have q possible cell states. Each of the first cell values and each of the second cell values can correspond to one of the q possible cell states. For a given set of values of r, n, and q, the algorithm can substantially maximize a minimum number of times that the variable can be updated in the memory, under a constraint that, when updating the variable in the memory, each of the n cells of the memory either remains in its previous cell state or progresses to a cell state higher than its previous cell state. The algorithm can substantially allow the variable to be updated in the memory at least a number of times including $[q/2^{r-1}]+r-2$ times; $(q-1)(n-2r+1)+r-1$ times; or $(q-1)(n-2)+1$ times, under a constraint that, when updating the variable in the memory, each of the n cells of the memory either remains in its previous cell state or progresses to a cell state higher than its previous cell state.

The memory can include multiple memory blocks. Each of the memory blocks can include multiple cells, and a particular one of the memory blocks may include a portion of the cells storing the first cell values and the second cell values. An operation may be performed to lower the state of each cell of the particular memory block to the lowest cell state. The operation to lower the state of each cell of the particular memory block to the lowest cell state can be performed at some time after one or more of the plurality of variables can no longer be updated under a condition that each of the cells of the particular memory block either remains in its previous cell state or progresses to a higher cell state.

Each of the plurality of possible cell states can be defined by a quantity of charge stored in one of the cells of the memory. One or more cell values can be detected, and each of the one or more detected cell values can correspond to a cell state of a particular one of the cells. Each of the cells can have two possible cell states, where each of the first cell values and each of the second cell values corresponds to one of the two possible cell states.

The first cell values can jointly represent multiple first store values of k variables. The multiple first store values can include a first store value of each of the k variables and one or more previous store values of each of the k variables. The second cell values can jointly represent multiple second store values. The multiple second store values can include a second store value of at least one of the k variables and the first store value of at the least one of the k variables.

The memory can be part of a system that includes a processor. The memory can be at least one of an optically encoded memory, a flash memory, a hard drive of a computer, a write asymmetric memory, or a write once memory.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
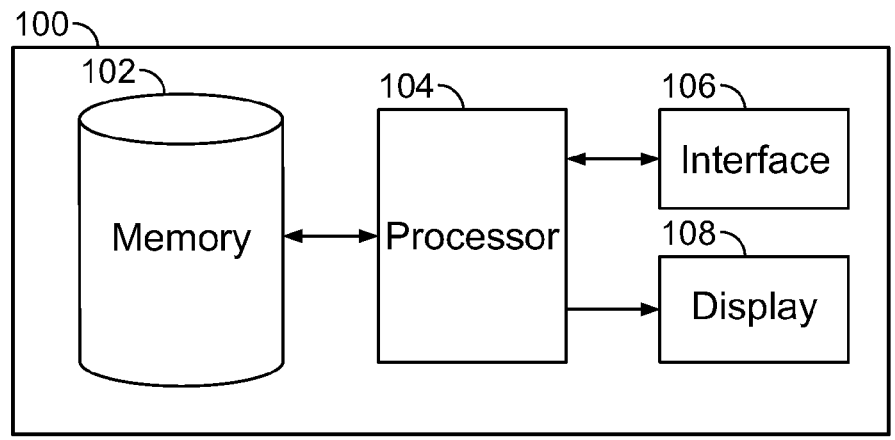
FIG. 1 is a diagram illustrating a computing system.

A memory may include multiple memory cells for storing information, and each of the memory cells may be able to assume multiple possible cell states. A memory cell may be described in terms of its possible cell states (e.g. "0" and "1" for a binary cell) and the transitions among its possible states (e.g. "0 to 1" and "1 to 0"). In a write asymmetric memory, such as a flash memory or an optically encoded memory, a different resource "cost" may be associated with different transitions. For example, a write operation (e.g. a transition where charge is injected into a flash memory cell) may be performed at a relatively low cost in terms of the amount of time and processing resources needed to perform the write operations, the amount of wear on the memory, and the lack of an impact on the other cells in the memory. On the other hand, an erase operation (e.g. a transition where charge is removed from a flash memory cell) may have a higher associated cost in terms of the need to erase an entire block of memory cells (e.g. due to the construction of at least some flash memories, which requires cells to be erased in blocks), the amount of time and processing resources needed to rewrite some or most of the information stored in the memory block (e.g. when only a portion of the cells need to be erased while the data stored in other cells needs to be retained), and the corresponding wear on the memory from erasing and rewriting the cells. The wear on the memory may include cell damage (i.e. a reduction in memory cell quality) associated with implementing a particular cell state transition. For example, in a flash memory, erasing a block of memory cells may reduce the quality of the memory cells (i.e. the ability to reliably control the charge level when erasing and writing to the cell), and the operational lifetime of a flash memory may be limited to a finite number (e.g. $10^5$) of erasures. Other types of memories may have additional or different costs associated with writing, rewriting, and erasing memory cells.

Techniques (e.g. a code construction) may be implemented in a memory to record and update a history of stored information using low cost operations. In some implementations, a code construction may be implemented to update a current value of one or more variables one or more times in a write asymmetric memory without requiring higher cost operations (e.g. erasing a memory block), and upon each update, the write asymmetric memory may record a sequence of one or more previous values of each updated variable. In some implementations, the sequence of previous values may be indicated by a state of one or more memory cells. Maintaining a sequence of past values in a memory may, for example, allow efficient recovery of information that has been rewritten one or more times. In some implementations, the cost of rewriting information may be reduced by increasing the number of rewrites implemented between erasures (i.e. in a single write/erase cycle). For example, current and previous values of one or more variables stored in a memory may be updated multiple times using only low-cost operations and without the use of high-cost operations (e.g. erasures). By using only low-cost operations to rewrite information to the memory, the effective memory speed may be increased. Furthermore, by allowing multiple (low-cost) information rewrite steps before each (high-cost) memory erasure, the number of memory rewrites allowed by the lifetime of a memory may be increased, therefore enhancing the effective lifetime of the memory.

Information stored in memory may be formatted as multiple variables. For example, each variable may be a binary or hexadecimal value, an ASCII character, or any other representation of information. Current and previous values of one or more variables may be stored jointly in the collective state of multiple memory cells. When storing multiple values jointly in the collective state of memory cells, the state of any one of the individual cells may be based on more than one of the values. In some implementations, neither an individual memory cell nor a subset of memory cells is allocated for storing an individual value of a variable. Rather, a group of memory cells are allocated for collectively storing the multiple values (e.g. current and previous values) of one or more variables. Storing information jointly may increase the number of times that one or more of the variables can be rewritten in the memory before erasure. For example, if the rewriting frequencies of the variables stored in a flash memory are non-uniform, jointly storing the variables in the collective state of multiple memory cells may increase the number of times that the most frequently rewritten variables can be updated in the memory before erasure (i.e. by increasing the charge stored in one or more cells without having to erase the cell). Thus, storing information jointly may reduce the number of memory erasures required for a given number of memory rewrites, which may extend the effective lifetime of the memory and/or increase the effective speed of the memory.

FIG. 1 is a diagram illustrating an example computing system 100. The computing system 100 includes a memory 102 in communication with a processor 104. The processor 104 may store information in the memory 102 and may retrieve information, such as software instructions and data, from the memory 102. The processor 104 may also communicate with an interface 106 and a display 108 for receiving input from a user and representing information to a user.

Figure 2:
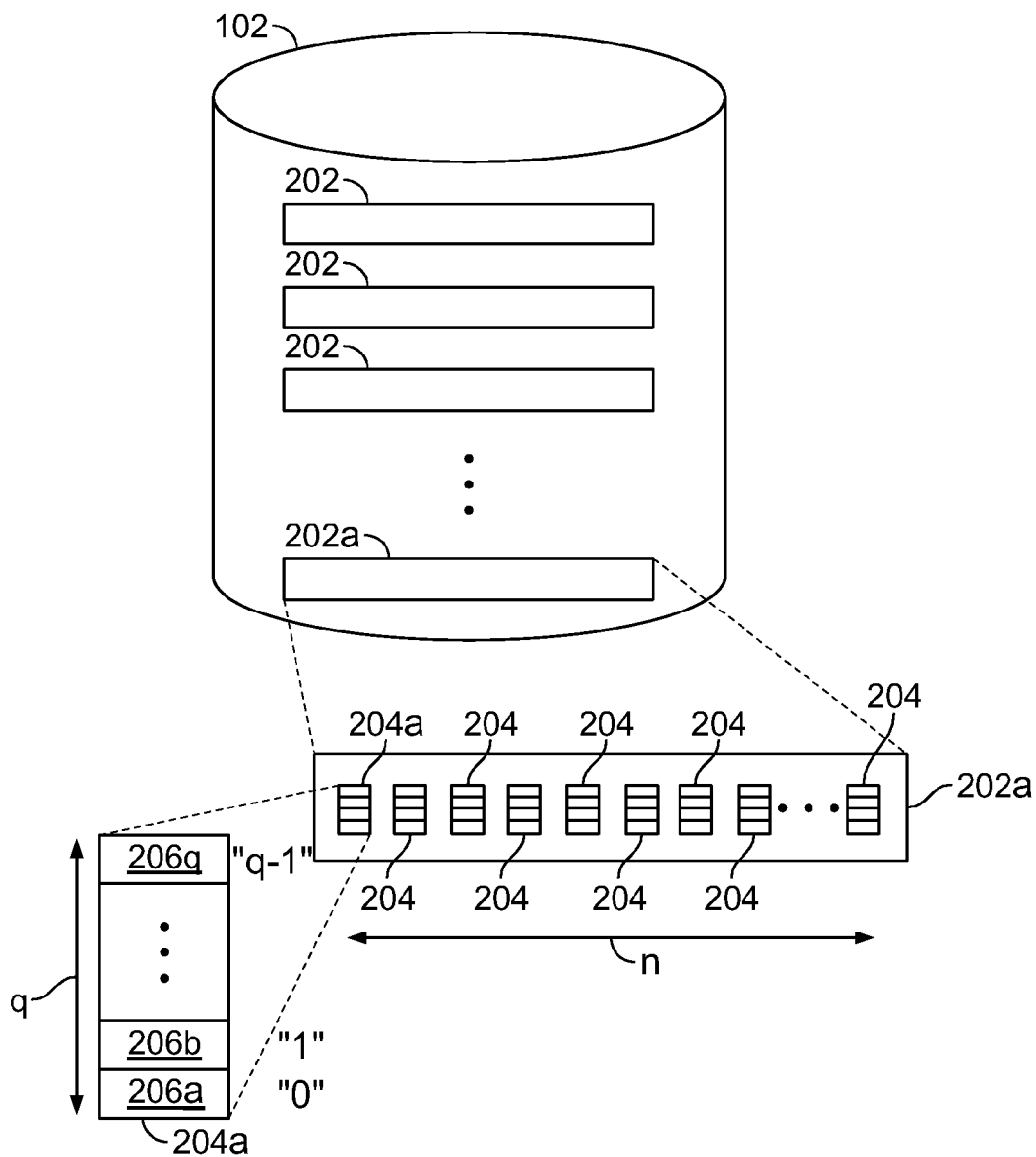
FIG. 2 is a diagram illustrating a memory system in accordance with some aspects of the present disclosure.

FIG. 2 is a diagram illustrating an example implementation of the memory 102. The memory 102 may include multiple memory blocks 202, where each memory block 202 includes multiple memory cells 204. Each of the memory cells 204 may be in one of multiple possible cell states $206a, 206b, \ldots 206q$ (collectively 206). Each state may be associated with a different sub-range of voltages within an overall range of voltages capable of being stored in each memory cell. The possible cell states 206 may be ordered sequentially from a lowest cell state (e.g. $206a$), which may correspond to a stored charge within a relatively narrow sub-range near zero volts, to a highest cell state (e.g. $206q$), which may correspond to a relatively narrow sub-range near a highest voltage used for storing data in the memory cells. Accordingly, each sequentially higher state may correspond to a progressively higher sub-range of voltages. In some implementations, each sub-range may be separated by some buffer zone of nominally unused voltages, which may help avoid reading incorrect values and facilitate error correction. The computing system 100 may allow information to be rewritten one or more times in the memory 102 using only operations that raise memory cells 204 from a lower cell state (e.g. $206a$) to a higher cell state (e.g. $206b$) and leave all other cells 204 in their previous cell states. By recording in the memory 102 a history of stored information, the system 100 may allow efficient recovery of previously written information (e.g. a previous value of a variable that has been updated and/or changed). By storing information jointly in the memory 102, the computing system 100 may increase the number of times that current and previous values of one or more variables can be updated in the memory 102 before erasing the cells. The system 100 may implement algorithms for efficiently encoding and/or decoding information stored jointly in the memory 102.

The computing system 100 may include a variety of features not included in the illustration, such as memory buffers, electronic sensors and devices, transducers, adapters, communication ports, power supplies, and others. Generally, the computing system 100 may be any electronic or information processing device that uses nonvolatile memory, such as a portable or desktop computer, a calculator, a sensor, a server, a client, a personal digital assistant (PDA), a media player or recorder, a game console, a mobile phone, an email device and/or a monitoring device. The computing system 100 may also omit one or more of the illustrated features. For example, when the computing system 100 is implemented as a sensor, the display 108 and/or the interface 106 may be omitted. In some implementations, one or more of the components of the system 100 may be implemented as an external system. For example, the interface 106 may be embodied as an external data entry system (e.g a keyboard or an electronic sensor).

The memory 102 may be nonvolatile memory, such as read-only memory (ROM), optically encoded memory (e.g., CD, DVD, or LD), magnetic memory (e.g., hard disk drives, floppy disk drives), NAND flash memory, NOR flash memory, electrically-erasable, programmable read-only memory (EEPROM), ferroelectric random-access memory (FeRAM), magnetoresistive random-access memory (MRAM), non-volatile random-access memory (NVRAM), non-volatile static random-access memory (nvSRAM), phase-change memory (PRAM), punch cards, and/or any other memory that does not need its memory contents periodically refreshed and/or can retain information without power. The memory 102 may include memory chips or memory modules (e.g., single in-line memory modules (SIMMs) or dual in-line memory modules (DIMMs)). The memory 102 may be electrically, magnetically, or optically erasable. Part or all of the memory 102 may be removable (e.g. CD, flash memory stick) or non-removable (e.g. hard disk).

The processor 104 may include a programmable logic device, a microprocessor, or any other appropriate device for logically manipulating information. The processor 104 may execute an operating system for the computing system 100. The processor 104 may store information on or access information from the memory 102. Information may be stored or accessed, for example, by a user of the computing system 100, an application running on the computing system 100, or an external computing system connected to the computing system 100. The information may include multiple variables stored jointly in the memory 102. The processor 104 may send information to the display 108 (e.g. for presentation to a user). The processor 104 may communicate with the interface 106, for example, to transmit information to an external system, to receive information from an external system, and/or to receive information from a user. Information may be communicated to/from the processor 104 as electromagnetic and/or optical signals. Processor 104 may communicate with the memory 102, the interface 106, and/or the display 108 via local electronic circuitry (e.g. passive, active, resistive, conductive, capacitive, inductive, and/or semiconductor materials), wireless and/or wired network protocols (e.g., TCP/IP, Bluetooth, and/or Wi-Fi), and/or a bus (e.g., serial, parallel, USB, and/or FireWire).

The interface 106 may allow communication with external systems (e.g. external systems not illustrated in FIG. 1). Interface 106 may communicate with external systems via local electronic circuitry (e.g. passive, active, resistive, conductive, capacitive, inductive, and/or semiconductor materials), wireless and/or wired network protocols (e.g., TCP/IP, Bluetooth, and/or Wi-Fi) and/or a bus (e.g., serial, parallel, USB, and/or FireWire). The display 108 may present data such as text, videos, music, and/or other information from the processor 104 and/or the memory 102. For example, the display 108 may present data in visual and/or audio format. Other types of user interface devices may be used in addition to or instead of the display, such as a screen, speakers, and/or graphical or tactile interfaces.

As shown in FIG. 2, a memory cell 204 may generally have q possible cell states 206, where q may be any integer greater than or equal to two. The q possible cell states 206a, 206b, ... 206q, may be selected based on physical (electronic, magnetic, mechanical and/or optical) properties of the cell 204 (e.g. electronic charge and/or threshold voltage) that can be reliably manipulated, maintained, and/or detected. For example, each of the possible cell states 206 for a flash memory may be defined as a specified amount of trapped charge in the cell 204; the state of the cell 204 may be manipulated by injecting charge into the cell 204 and may be detected by measuring a voltage of the cell 204 and comparing the measured voltage with thresholds that correspond to the different cell states.

In some implementations, the sequential ordering of possible cell states 206 may be arbitrary. However, typically the sequential ordering of the possible cell states 206 may correspond to the order in which the cell 204 traverses the possible cell states 206 under the action of one or more of the operations available for manipulating the state of the memory cell 204. Continuing the example of the flash memory, the possible cell states 206 may be ordered sequentially according to the trapped charge specified by each state. For example, if an available memory operation includes injecting electrons into the cell 204, the lowest cell state (e.g. 206a) may be defined as the state that occurs when the cell 204 comprises the highest trapped charge (i.e. the fewest trapped electrons) and the highest cell state (e.g. 206q) may be defined as the state that occurs when the cell 204 comprises the least trapped charge (i.e. the most trapped electrons). Intermediate cell states (e.g. 206b, etc.) may be ordered sequentially (i.e. from lower cell states to higher cell states) in order of decreasing trapped charge (i.e. increasing number of trapped electrons). Alternatively, the possible cell states 206 may be sequentially ordered according to any other specification. For example, in some implementations, the possible cell states 206 may be ordered sequentially from the lowest cell state (e.g. 206a) to the highest cell state (e.g. 206q) in order of increasing trapped charge (i.e. decreasing number of trapped electrons), which may be useful for memories in which cells are erased by injecting electrons up to some level and data is written by selectively removing electrons from the cell.

Each of the possible cell states (206a, 206b, etc.) may be labeled or associated with a cell value. For example, as illustrated in FIG. 2, the cell value "0" may correspond to the lowest cell state (e.g. 206a), the cell value "1" may correspond to the second lowest cell state (e.g. 206b), and the cell value "q−1" may correspond to the highest cell state (e.g. 206q). Other labeling schemes may also be used. For example, the cell value "0" may correspond to the highest cell state (e.g. $206q$), the cell value "q−2" may correspond to the second lowest cell state (e.g. $206b$), and the cell value "q−1" may correspond to the lowest cell state (e.g. $206a$). For the purposes of the present disclosure, a cell state may be referred to by the cell value corresponding to that state. For example the cell state $206a$ may be referred to as the cell state "0." In the examples provided in FIGS. 3B and 3C, the lowest cell state corresponds to the cell value "0" and the highest cell state corresponds to the cell value "q−1."

Erasing a memory cell 204 may include lowering the memory cell to its lowest cell state (e.g. the cell state "0"). In some implementations, memory cells 204 may not be individually erasable. For example, the operation for erasing the memory cell $204a$ may necessitate erasing all of the memory cells 204 of memory block $202a$. In other implementations, the memory cells 204 may be individually erasable, and individually erasing a memory cell $204a$ may include a high-cost operation (i.e. an operation that uses more computational resources, such as time, energy, hardware, and/or hardware damage, than other operations). Therefore, reducing the number of memory erasures performed while using the memory 102 may improve the effective speed, efficiency, and/or operational lifetime of the memory 102.

Writing a cell value to a memory cell 204 may include performing operations that cause the memory cell 204 to assume the cell state corresponding to the cell value. For example, writing the cell value "1" to memory cell $204a$ may include raising the state of cell $204a$ from the lowest cell state $206a$ (corresponding to the cell value "0") to the second lowest cell state $206b$ (corresponding to the cell value "1"). In some implementations, writing a cell value to a memory cell 204 may be done using low-cost operations (i.e. an operation that uses less computational resources, such as time, energy, hardware, and/or hardware damage, than other operations), such as raising the state of the memory cell 204 by injecting charge into the cell 204. In some implementations, cell values may be written to the cells 204 of the memory 102, and new cell values may be rewritten to the cells 204 of the memory 102 before any of the memory cells 204 are erased (or new cell values may be written to the subset of the cells 204 of the memory 102 before any of the memory cells 204 in the subset are erased). A write/erase cycle may refer to the sequence of writing, rewriting (one or more times), and erasing cell values on one or more memory cells 204.

In some implementations, the operational lifetime of the memory 102 may be roughly bound by a finite number (e.g. $10^5$) of erasures (i.e. write/erase cycles). As the finite number of erasures approaches, the reliability of manipulating, maintaining, and/or detecting the state of a memory cell 204 may become reduced. At some point, the reliability may render the memory cell 204 effectively or actually unusable because the memory may be incapable of storing data for an acceptable period of time and/or may require an unacceptable amount of error correction. For example, after a certain number of erasures of a flash memory cell, the flash memory cell may tend to leak electrons, impairing the ability of the flash memory cell to maintain a specified amount of charge. As another example, after a certain number of erasures, the ability to erase a flash memory cell (i.e. to remove some or all of the trapped electric charge) may be reduced. Therefore, increasing the number of times that information can be written to the memory 102 before the memory 102 is erased may increase the effective lifetime of the memory 102. The techniques described here may increase the number of times that information can be rewritten to the memory block 202 before the memory block 202 is erased.

The information stored in the memory 102 may include current and previous values of multiple variables. A variable may be a label representing one of a well-defined set (i.e. an alphabet) of possible values. The value (or store value) of a variable may be the particular one of the possible values represented by a variable in the memory 102. A variable, for example, may be an integer variable, a fixed point variable, a floating point variable, a single- or double-precision variable, or others. The current and previous values of a variable may be stored as a time-ordered sequence of values.

When the current and previous store values of one or more variables are stored in a memory block $202a$, the store values may be mapped to a corresponding set of cell values, and the cell values may be subsequently written to the memory cells 204 of the memory block $202a$. For example, a variable v may have a current store value of 0 and previous store values of 1 and 0, 1 being the most recent store value and 0 being the second most recent store value. In a particular example, if the current value and two most recent store values of the variable v are to be jointly stored in the state of a single memory cell $204a$, the sequence of store values (0, 1, 0) may be mapped to the cell value "3." The cell value "3" may then be written to the memory cell $204a$. If the state of the variable v is then updated to a current store value of 1, the most recent store value would be 0 and the second most recent store value would be 1. The sequence of store values (1, 0, 1) may then be mapped to the cell value "7," and the cell value "7" may be written to the memory cell. Subsequently, the state of the memory cell $204a$ may be detected, and the cell values corresponding to the detected cell state may be used to recover the current, the most recent, and/or the second most recent store values of the variable v.

The mapping between cell values (which designate cell states) and store values (which designate values of variables) may be defined arbitrarily and stored, for example, as a table. In some implementations, the mapping between cell values and store values may be defined algorithmically, for example, by a code construction. A code construction may allow current and previous values of multiple variables to be stored jointly in a plurality of memory cells and may increase the number of times that one or more variables can be updated before the state of any one of the plurality of memory cells is lowered (e.g. by erasure). In some implementations, a code construction may include an algorithm that maximizes, substantially maximizes, or otherwise provides a relative increase in, a minimum number of times that current and previous values of one or more variables can be updated in the memory 102 without erasing one or more of the memory cells 204, under a constraint that, when updating the variables in the memory, each of the memory cells 204 either remains in its previous cell state or progresses to a cell state higher than its previous cell state.

In some implementations, a code construction may implement error correction. For example, the system 100 may implement an error-correcting code construction that allows errors to be removed from information stored in and/or read from the memory 102. An error-correcting code construction may be based on an error model. The error model may be based on noise and/or error parameters, such as maximum read errors. Error parameters may be calculated based on measurements of noise affecting the memory 102 or the processor 104.

A number of example code constructions are described in the present disclosure and with regard to the figures. In at least some implementations, any code construction and/or algorithm for storing current and past of values of one or more variables jointly in a memory and/or for updating current and past of values of one or more variables jointly in a memory may be used. Some of the concepts of the present disclosure are demonstrated in the examples, but the concepts of the present disclosure are not necessarily limited to the details of any of the examples.

In the context of the following examples, a sequence of r store values (one current store value and the r−1 most recent store values) of a variable may be stored in a memory comprising n memory cells, where n may be a positive integer. According to various embodiments, r may be less than, equal to, or greater than n. Each of the n memory cells may include q possible cell states, ordered from a lowest cell state, corresponding to a cell value of "0," to a highest cell state, corresponding to a cell value of "q−1". A value of q may be an integer greater than 1. In the examples, a variable has an alphabet of size 2: {0,1}, meaning that each store value of the variable may be one of 2 possible values. In general, a variable of arbitrarily large alphabet may be stored in the n memory cells.

A variable vector (e.g. $(v_1, v_2, \ldots, v_r)$ where $v_i \in \{0,1\}$) may represent a sequence of store values that includes one current store value $v_r$ and the r−1 most recent store values $(v_1, v_2, \ldots v_{r-1})$. For example, $v_{r-1}$ may be the most recent store value, $v_{r-2}$ may be the second most recent store value, and so forth. A cell state vector (e.g. $(c_1, c_2, \ldots c_n)$ where $c_i \in \{0, 1, \ldots q-1\}$) may represent the collective state of the n cells of the memory. A cell state vector may include n cell values, each cell value corresponding to the state of one of the n memory cells. According to some implementations, a code construction may map a cell state vector to exactly one variable vector, and a code construction may map a variable vector to more than one cell state vector. A code construction may identify the particular cell state vector to be rewritten to the memory cells based on the current states of the memory cells in addition to the updated current store value of the variable. A code construction may be embodied as instructions (e.g. including rules, formulae, and/or tables) encoded on a tangible medium, such as the memory 102 of FIGS. 1 and 2, and executed by a processor, such as the processor 104 of FIG. 1.

Figure 3A:
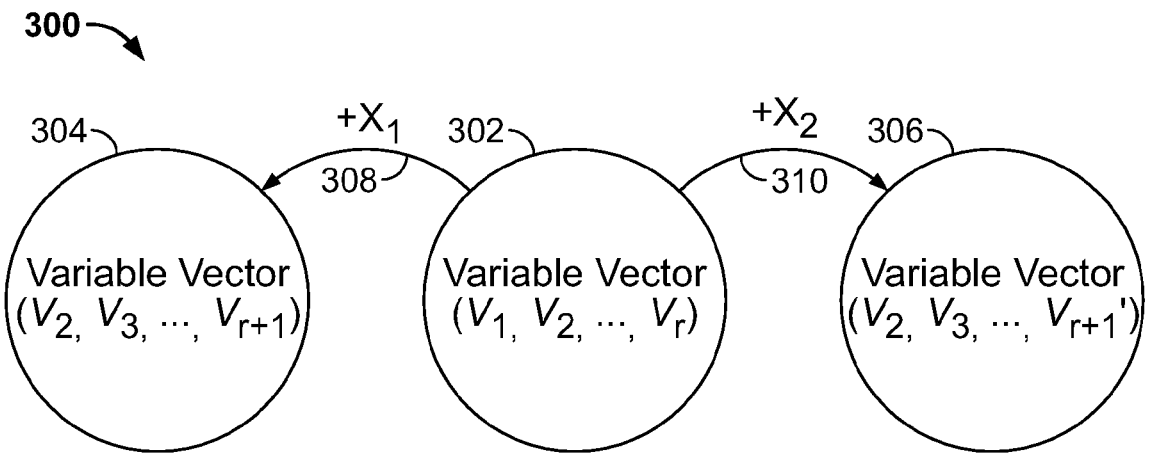
FIG. 3A is a graphical representation of a code construction in accordance with some aspects of the present disclosure.
Figure 3B:
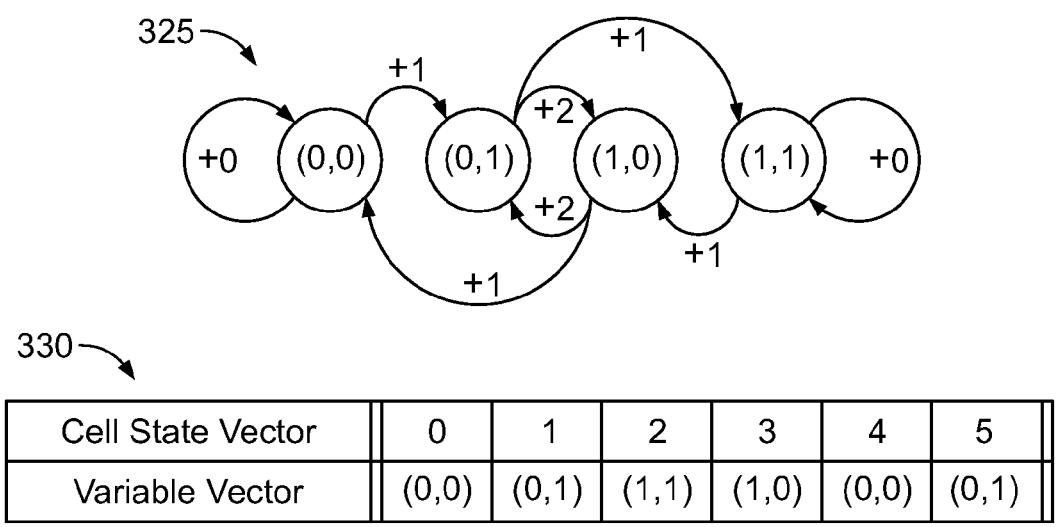
FIGS. 3B and 3C are diagrams and tables illustrating example code constructions in accordance with some aspects of the present disclosure.
Figure 3C:
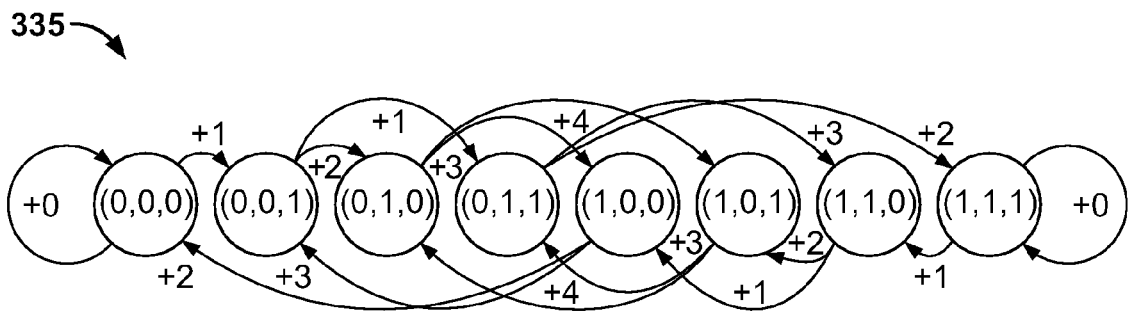

FIG. 3A is a diagram illustrating a graphical representation of a code construction in accordance with some aspects of the present disclosure. FIGS. 3B and 3C are diagrams and tables illustrating example code constructions in accordance with some aspects of the present disclosure. The graphical conventions used in FIG. 3A are used consistently through FIGS. 3B and 3C. A value or set of values illustrated inside of a circle represents a variable vector. Circle 302 represents the variable vector $(v_1, v_2, \ldots v_r)$ for a variable v. Circle 304 represents an updated variable vector (e.g. $(v_2, v_3, \ldots v_{r+1})$) after the current store value of the variable v has changed from $v_r$ to $v_{r+1}$. Circle 306 represents an updated variable vector (e.g. $(v_2, v_3, \ldots v_{r+1}')$) after the current store value of the variable v has changed from $v_r$ to $v_{r+1}'$. Arrow 308 indicates an operation $+x_1$ may be applied to the n memory cells to represent that the current store value of the variable v is changed from $v_r$ to $v_{r+1}$. The operation $+x_1$ may indicate a cell state transition, for example, that the cell state of a memory cell is raised by an amount $x_1$. Arrow 310 indicates an operation $+x_2$ may be applied to the n memory cells to represent that the current store value of the variable v is changed from $v_r$ to $v_{r+1}'$.

Code Construction CC-I (n=1, q>1, r>0)

A Code Construction CC-I is an example code construction that can be used to implement the described techniques. The code CC-I may be generated for any set of values satisfying n=1, q>1, and r>0 according to the mapping $f_r$, which maps a cell value x to a binary variable vector of length r. The mapping $f_r$ may be a surjective mapping from N to $\{0, 1\}^r$, defined as:

$$f_1(x) = x \bmod 2$$

and for r>0, $$f_{r+1}(x) = (0, f_r(x)), \text{ if } (x \bmod 2^{r+1}) < 2^r$$

$$f_{r+1}(x) = (1, \overline{f_r(x)}), \text{ otherwise.}$$

The overbar denotes the NOT function (e.g. $\overline{0}=1$ and $\overline{1}=0$), and "mod" denotes the modulus function (e.g. 3 mod 3=0; 4 mod 3=1; 5 mod 3=2; 6 mod 3=0). The code construction CC-I is further described by particular examples of the code CC-I illustrated in FIGS. 3B and 3C. Some code constructions may allow specification of a value t, the minimum number of times that any one of the stored variables can be updated under a condition that each of the n cells of the memory begins in the lowest cell state and each of the n cells of the memory either remains in its previous cell state or progresses to a higher cell state upon each update. In some implementations, the code CC-I may allow t equal to $\lceil q/2^{r-1} \rceil + r - 2$.

FIG. 3B includes a diagram 325 and a table 330, which collectively illustrate an example code construction CC-IB, which is an example of the code CCI for the case of n=1, q=6, r=2. The code CC-IB defines a mapping between cell values and store values of a single variable v, wherein a current store value and a most recent store value of the variable v are stored jointly on a single memory cell comprising six possible cell states. The code CC-IB may allow t equal to three. FIG. 3C includes a diagram 335 and a table 340, which collectively illustrate an example code construction CC-IC, which is an example embodiment of the code CCI for the case of n=1, q=12, r=3. The code CC-IC defines a mapping between cell values and store values of a single variable v, wherein a current store value and two most recent store values (i.e. a most recent store value and a second most recent store value) of the variable v are stored jointly on a single memory cell comprising twelve possible cell states. The code CC-IC may allow t equal to four.

As shown in the diagram 325 of FIG. 3B, if the current store value is 1 and the most recent store value is 0 (i.e. the variable vector is (0, 1)), the current store value may be updated to 1 (i.e. making the variable vector (1, 1)) by raising the state of the memory cell by "+1." Similarly, if the current store value is 1 and the most recent store value is 0 (i.e. the variable vector is (0, 1)), the current store value may be updated to 0 (i.e. making the variable vector (1, 0)) by raising the state of the memory cell by "+2." For example, if the current cell state is "1," the current store value is 1, and the most recent store value is 0 (i.e. the variable vector is (0, 1)), then updating the value of the variable v to 0, then to 0, then to 1, may be represented in the memory cell by changing the cell state as "1"→"3"→"4"→"5" (e.g. because "1"+→"3"; "3"+"4"; "4"+"5").

As shown in the table 330 of FIG. 3B, if the memory cell is in the state corresponding to either the cell value "0" or the cell value "4," the current store value and the most recent store value may both be 0 (i.e. the variable vector (0, 0)). Similarly, if the memory cell is in the state corresponding to either the cell value "1" or the cell value "5," the current store value may be 1 and the most recent store value may be 0 (i.e. the variable vector (0, 1)). If the memory cell is in the state corresponding to the cell value "2," both the current store value and the most recent store value may be 1 (i.e. the variable vector (1, 1)). If the memory cell is in the state corresponding to the cell value "3," the current store value may be 0 and the most recent store value may be 1 (i.e. the variable vector (1, 0)).

The diagram 335 of FIG. 3C uses the same conventions as the diagram 300 of FIG. 3A and the diagram 325 of FIG. 3B. For example, if the current store value is 1, the most recent store value is 0, and the second most recent store value is 0 (i.e. the variable vector (0, 0, 1)), the current store value may be updated to 1 (i.e. making the variable vector (0, 1, 1)) by raising the state of the memory cell by "+1." Similarly, if the current store value is 1, the most recent store value is 0, and the second most recent store value is 0 (i.e. the variable vector (0, 0, 1)), the current store value may be updated to 0 (i.e. making the variable vector (0, 1, 0)) by raising the state of the memory cell by "+2." The table 340 of FIG. 3C uses the same format as table 330 of FIG. 3B. For example, if the memory cell is in the state corresponding to either the cell value "0" or the cell value "8," the current store value, the most recent store value, and the second most recent store value are all 0 (i.e. the variable vector (0, 0, 0)).

Code Construction CC-II ($n \geq 2r$, $q > 1$, $r > 0$)

An alternative Code Construction CC-II may be generated for any set of values satisfying $n = \geq 2r$, $q > 1$, and $r > 0$. In some implementations, the code CC-II may allow a value of t that is asymptotically maximal as n and q become large (e.g. as n and/or q approaches infinity). The code CC-II may allow $t = (q-1)(n-2r+1) + r - 1$.

The code CC-II is first presented for the case of $q=2$, and then the code CC-II is extended for arbitrarily large values of q (e.g. $q > 2$). The code CC-II may begin with all of the n memory cells in the cell state "0" (e.g. the cell state vector (0, 0, 0, 0, 0) for n=5). The set of cell state vectors that may be written to the memory cells after i times of rewriting may be referred to as the i-th generation of cell state vectors. For example, for n=5, the $1^{st}$ generation of cell state vectors may include the cell state vectors (0, 0, 0, 0, 1), (0, 0, 0, 1, 0), (0, 0, 1, 0, 0), (0, 1, 0, 0, 0), and (1, 0, 0, 0, 0). A valid cell state vector in the i-th generation $(c_1, c_2, \ldots, c_n)$ may have the property that, for $i=1, 2, \ldots, n-r$, there are i cells in the state "1" and there are n-i cells in the state "0." Furthermore, the i cells in the state "1" may belong to the set $\{a_1, a_2, \ldots, a_{i+r}\}$ (e.g. the first i+r cells). A valid cell state vector $(c_1, c_2, \ldots, c_n)$ may be in the $$\left(\sum_{i=1}^{n} c_i\right)\text{-}th$$

generation. According to the code CC-II, a valid cell state vector $(c_1, c_2, \ldots, c_n)$ in the i-th generation may be mapped to a variable vector $(v_1, v_2, \ldots, v_n)$ for a variable v as follows: for $j=1, 2, \ldots, r$, $v_j = c_{i+j}$.

For the case of q=2, the code CC-II may enable the variable v to be updated n-r times (i.e. the code CC-II may allow n-r writing operations). For example, the n memory cells may be in a collective state corresponding to the valid cell state vector $(x_1, x_2, \ldots, x_n)$ of the i-th generation (where $0 \leq i \leq n-r$), and updating the variable v may change the current store value to y. In some implementations, updated cell values may be written to the memory cells only when an update to the variable v changes the variable vector. Therefore, if the variable vector is (0, 0, ..., 0) or (1, 1, ..., 1), then updated cell values may not be written to the memory cells when y equals 0 or 1, respectively. Proceeding with the example, the cell state vector may be updated as follows: if y=0, an integer $j \leq i+1$ may be found such that $x_j = 0$, and $c_j$ (i.e. the state of the j-th cell) may be changed to "1;" and if y=1, then $c_{i+r+1}$ may be changed from "0" to "1."

A specific example implementation of the code CC-II is presented for the case n=9, q=2, and r=3. If updating the variable v six times in the memory (i.e. n−r=6 writing operations) changes the variable vector as (0, 0, 0)→(0, 0, 1)→(0, 1, 1)→(1, 1, 0)→(1, 0, 0)→(0, 0, 1)→(0, 1, 0), then the cell state vector representing the collective state of the n=9 memory cells may change as (0, 0, 0, 0, 0, 0, 0, 0, 0)→(0, 0, 0, 1, 0, 0, 0, 0, 0)→(0, 0, 0, 1, 1, 0, 0, 0, 0)→(0, 0, 1, 1, 1, 0, 0, 0, 0)→(0, 1, 1, 1, 1, 0, 0, 0, 0)→(0, 1, 1, 1, 1, 0, 0, 1, 0)→(0, 1, 1, 1, 1, 0, 1, 0). A cell state vector may be mapped to a variable vector by reading the (w+1)-th, (w+2)-th, ..., (w+r)-th entries in the cell state vector, where w is the number of "1" cell values occurring in the cell state vector.

The code CC-II may be extended from q=2 to arbitrary q (e.g. $q > 2$). The code CC-II may use the n memory cells "layer by layer." When $q > 2$, for the first n−r updates (i.e. rewrites), the memory cells may be used in the same manner as they are used for the case of q=2 (i.e. using only two cell states, "0" and "1," of the q possible cell states). If updating the variable v for the (n−r+1)-th time changes the variable vector to $(v_1=z_1, v_2=z_2, \ldots, v_r=z_r)$, the (n−r+1)-th writing operation may be carried out as follows: (1) every cell may be raised to the cell state "1"; (2) the cell state vector (1, 1, ..., 1) may be treated as the cell state vector (0, 0, ..., 0) is treated in the first n−r updates; (3) the cell state "1" may be treated as the cell state "0" is treated in the first n−r updates, and the cell state "2" may be treated as the cell state "1" is treated in the first n−r updates, including the way cell state vectors are mapped to variable vectors and the way writing operations are performed; (4) r successive rewriting operations may be performed, where the i-th rewriting operation ($1 \leq i \leq r$) changes the current store value of the variable (i.e. $v_r$) to $z_i$. After the r-th rewrite, the cell state vector may correspond to the variable vector $(v_1=z_1, v_2=z_2, \ldots, v_r=z_r)$, and the two cell states "1" and "2" may be used to perform further updates as the two cell states "0" and "1" are used to perform the first n−r updates. The code CC-II may allow (n−2r+1) updates to be performed using the two cell states "1" and "2" as described herein. The code CC-II may proceed by using the cell states "2" and "3" (and generally the cell states "m−1" and "m" for m<q) for updating the variable v in a similar manner.

A specific example implementation of the code CC-II is presented for the case n=9, q=4, and r=3. The collective state of the n=9 memory cells may be represented by the cell state vector (0, 1, 1, 1, 1, 1, 0, 1, 0), which may be in the (n−r)-th generation and correspond to the variable vector (0, 1, 0). If updating the variable v three times in the memory changes the current store value to 1, 0 and 1 successively, then the cell state vector representing the collective state of the n=9 memory cells may change as (0, 1, 1, 1, 1, 1, 0, 1, 0)→(1, 1, 2, 2, 1, 2, 1, 1, 1)→(1, 2, 2, 2, 1, 2, 1, 1, 1)→(1, 2, 2, 2, 1, 2, 1, 2, 1).

Code Construction CC-III ($n > 0$, $g > 1$, $r = 2$)

Another Code Construction CC-III may be generated for any set of values satisfying $n > 0$, $q > 1$, and $r = 2$. For the case of q=2, the code CC-III may maximize, substantially maximize, or otherwise increase the value of t (e.g. $t = (n-1)$). More generally, the code CC-III may allow a value of t equal to $(q-1)(n-2)+1$.

The code CC-III is first presented for the case of q=2, and then the code CC-III is extended for arbitrarily large values of q (e.g. $q > 2$). The code CC-III may use the same technique as the code CC-III to map cell state vectors of the $1^{st}$, $2^{nd}$, ..., (n−2)-th generations to variable vectors, adding the following specifications to handle the first n−2 rewriting operations:

The n memory cells may be in a collective state corresponding to the cell state vector $(x_1, x_2, \ldots, x_n)$ of the i-th generation (where $0 \leq i \leq n-2$), and the corresponding variable vector may be $(v_1 = x_{i+}, v_2 = x_{i+2})$.) Updating the variable v may change the current store value to y, and rewriting the memory cells may be performed as follows: (1) if y=0 and $(x_{i+1}, x_{i+2}) = (0, 1)$, then $c_{i+1}$ (i.e. the state of the (i+1)-th cell) may be changed to "1"; (2) if y=0 and $(x_{i+1}, x_{i+2}) = (1, 0)$, an integer $j \leq i$ may be found such that $x_j = 0$, and $c_j$ may be changed to "1"; (3) if y=0 and $(x_{i+1}, x_{i+2}) = (1, 1)$, then an integer $j \leq i$ may be found such that "$x_j = 0$ and (i+3)−j is an even integer," and $c_j$ may be changed to 1; (4) if y=1, $c_{i+3}$ may be changed from "0" to "1."

A valid cell state vector in the (n−1)-th generation may have the property that, among the n memory cells, n−1 of the cells are in the cell state "1" and one of the cells is in the cell state "0." A valid cell state vector in the (n−1)-th generation may be mapped to a variable vector $(v_1, v_2)$ according to the following specifications: (1) if $i \leq n-2$ and if n−i is even, then $(v_1, v_2) = (1, 0)$; (2) if $i \leq n-2$ and if n−i is odd, then $(v_1, v_2) = (0, 0)$; (3) if i=n−1, then $(v_1, v_2) = (1, 1)$; (4) if i=n, then $(v_1, v_2) = (0, 1)$.

After the variable v has been updated in the memory n−2 times (i.e. after the (n−2)-th rewrite), the collective state of the memory cells may be represented by the cell state vector $(x_1, x_2, \ldots, x_n)$, and the corresponding variable vector may be $(v_1 = x_{n-1}, v_2 = x_n)$. If the (n−1)-th update of the variable v is to change the store value to y, then, according to the code CC-III, the update may be performed according to the following specifications: (1) If either "y=0 and $(x_{n-1}, x_n) = (0, 1)$" or "y=1 and $(x_{n-1}, x_n) = 0, 0)$," then $c_{n-1}$ may be changed from "0" to "1"; (2) If y=0 and $(x_{n-1}, x_n) = (1, 0)$, then $c_n$ may be changed from 0 to 1; (3) If y=0 and $(x_{n-1}, x_n) = (1, 1)$, then an integer j may be specified such that $j \leq n-2$, $x_j = 0$, and n−j is odd, and $c_j$ may be changed from "0" to "1"; (4) If y=1 and $(x_{n-1}, x_n)$=either (0, 1) or (1,0), then an integer j may be specified such that $j \leq n-2$ and $x_j = 0$, and $c_j$ may be changed from "0" to "1".

A specific example implementation of the code CC-III is presented for the case n=6, q=2, r=2. If updating the variable v five times in the memory changes the variable vector as (0, 0)→(0, 1)→(1, 0)→(0, 1)→(1, 1)→(1, 0), then the cell state vector representing the collective state of the n=6 memory cells may change as (0, 0, 0, 0, 0, 0)→(0, 0, 1, 0, 0, 0)→(0, 1, 1, 0, 0)→(0, 1, 1, 0, 1, 0)→(0, 1, 1, 0, 1, 1,)→(1, 1, 1, 0, 1, 1).

Figure 4:
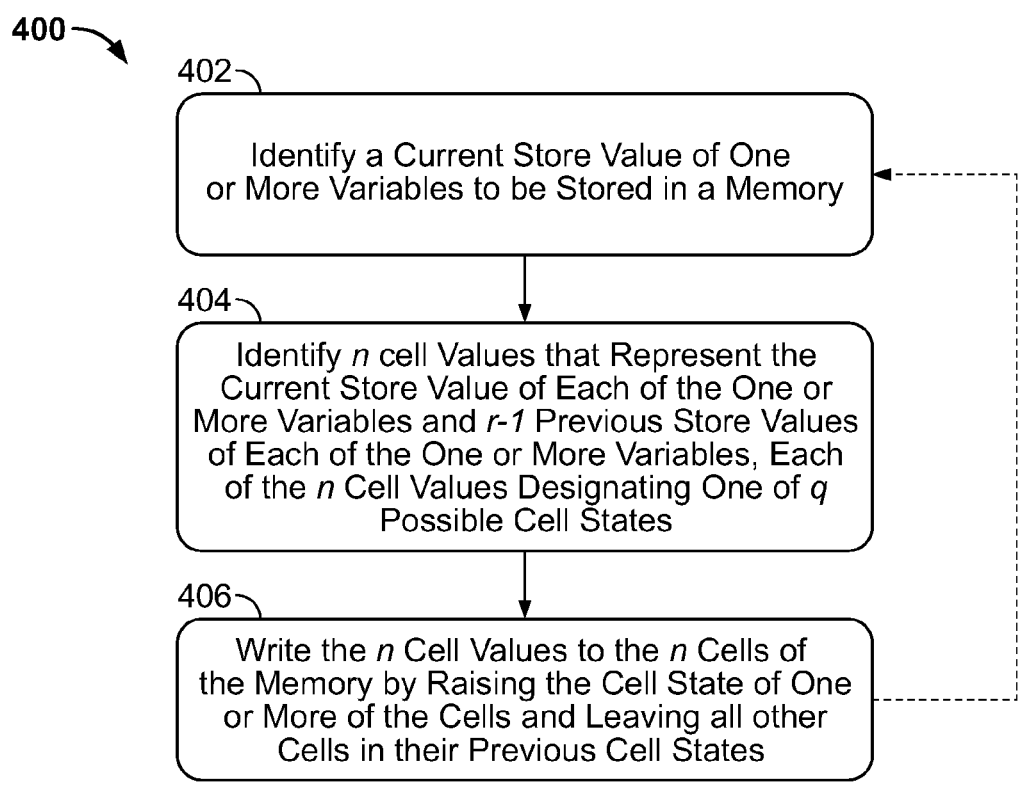
FIG. 4 is a flow chart illustrating an example process for storing information in a memory in accordance with some aspects of the present disclosure.

FIG. 4 is a flow chart illustrating an example process 400 for storing information in a memory. The process 400 may generally be used for storing and updating information in a memory. In particular, the process 400 may be used for storing and updating multiple store values of each of one or more variables jointly in the collective state of one or more cells of a memory. The multiple store values may include a current store value of each of the one or more variables as well as one or more previous values of each of the one or more variables. Additionally, the process 400 may be used to update information stored in memory cells using only operations that transit the memory cells to higher cell states and leave all other memory cells in their previous cell states. The process 400 may be used for storing information in the memory 102 of FIG. 1.

At 402, current store values of one or more variables to be stored in a memory may be identified. The memory may, for example, be the memory 102 of FIGS. 1 and 2. In some implementations, the memory may comprise any of an optically encoded memory, a flash memory, a hard drive of a computer, a write asymmetric memory, and/or a write once memory. A write once memory may include cells that only transit in one direction (e.g. to higher cell states or to lower cell states). For example, a punch card or an optically encoded memory (e.g. CD-ROM) may comprise a write once memory.

The memory may include one or more memory cells (e.g. n memory cells). Each of the n cells may comprise a plurality of possible cell states sequentially ordered from a lowest cell state to a highest cell state. The collective state of the n cells may jointly represent a plurality of store values, the plurality of store values including the current store values and one or more previous store values of each of the one or more variables. The cell state of at least one of the n cells values may be individually based at least in part on more than one of the plurality of store values.

At 404, n cell values representing the current store value and r−1 previous store values of the one or more variables are identified, where each of the n current cell values corresponds to of q possible cell states. The q possible cell states may be defined, for example, as a specified amount of trapped charge in a cell. The possible cell states may be ordered sequentially from the lowest cell state to the highest cell state in order of increasing or decreasing trapped charge. In some implementations, each memory cell may comprise q=2 possible cell states, which may correspond to a binary system. In other implementations, each memory cell may comprise q>2 possible cell states. In some implementations, the n cell values are determined based at least in part on a code construction, and the code construction may include an algorithm having inputs comprising the current store value of each of the one or more variables and/or the current state of one or more of the n cells of the memory.

In some implementations, each of the one or more variables comprises two possible store values, and each of the current (and each of the previous) store values may correspond to one of the two possible store values. Writing the n current cell values to the n cells of the memory may comprise updating the one or more variables in the memory. In some implementations, the one or more variables may comprise a single variable, and for a given set of values of n, r, and q, an algorithm may substantially maximize a minimum number of times that the variable can be updated in the memory, under a constraint that, when updating the variable in the memory, each of the n cells of the memory either remains in its previous cell state or progresses to a cell state higher than its previous cell state.

At 406, the n current cell values are written to the n cells by raising the state of one or more of the cells and leaving other cells in their previous cell states. In some implementations, the one or more variables may be updated multiple times. Each time the one or more variables are updated, the process 400 may return to 402 and proceed. In some implementations, the process may implement 402, 404, and 406 as many times as it is possible (e.g. t times) to update the one or more variables under the condition that, each time one or more of the variables is updated, none of the n cells is transited to a lower state. In some implementations, after the one or more variables is updated, the memory cells may subsequently be erased or lowered to a lower cell state (e.g. the lowest cell state). For example, the memory cells may be erased once there are no available higher cell states.

In some implementations, the one or more variables include a single variable, and the i-th time that the variable is updated, an i-th plurality of store values are stored in the n memory cells. The i-th plurality of store values may include an i-th current store value and an i-th set of r−1 previous store values. The i-th set of r−1 previous store values may include the (i−1)-th current store value and one or more of the (i−1)-th set of r−1 previous store values. In some implementations, each plurality of store values may comprise two store values (i.e. r=2) including a current store value and a most recent store value of the variable.

A number of embodiments of the invention have been described. Nevertheless, it will be understood that various modifications may be made without departing from the spirit and scope of the invention. For example, code constructions other than the examples described herein may be used to store and update information (e.g. current and previous values of variables) in a memory. Furthermore, a code construction may implement additional, fewer, and/or different operations than the examples described herein, and a code construction may implement the operations in an order other than the order described in the examples. Accordingly, other embodiments are within the scope of the following claims.

What is claimed is:

1. A method comprising:
   representing at least one variable with at least one cell value in a memory, wherein each variable is associated with one or more of the cell values; and
   defining multiple states of the at least one variable, wherein each of the multiple states of the at least one variable comprises a current store value for each variable and at least one previous store value for the variable, and at least one single cell value influences the current store value and previous store value of the at least one variable.

2. The method of claim 1 comprising:
   writing n first cell values to n cells of a memory, each of the n cells comprising a plurality of possible cell states sequentially ordered from a lowest cell state to a highest cell state, each of the n first cell values corresponding to one of the plurality of possible cell states, the n first cell values jointly representing a first plurality of store values of a variable, the first plurality of store values comprising a first store value of the variable and one or more previous store values of the variable, at least one of the n first cell values comprising an individual cell value based at least in part on more than one of the first plurality of store values; and
   writing n second cell values to the n cells of the memory, each of the n second cell values corresponding to one of the plurality of possible cell states, each of the n cells of the memory either remaining in its previous cell state or progressing to a cell state higher than its previous cell state, the n second cell values jointly representing a second plurality of store values of a variable, the second plurality of store values comprising a new store value of the variable and one or more previous store values of the variable.

3. The method of claim 2, wherein the second plurality of store values includes the first store value of the variable.

4. The method of claim 3, wherein the first plurality of store values and the second plurality of store values each comprises two store values, the one or more previous store values comprising a most recent store value of the variable.

5. The method of claim 3, wherein the second plurality of store values further comprises at least one of the one or more previous store values of the variable included in the first plurality of store values.

6. The method of claim 3, wherein the first plurality of store values and the second plurality of store values each comprises r store values, r comprising a value greater than one, the second plurality of store values comprising r−1 of the first plurality of store values.

7. The method of claim 6, wherein the n second cell values are determined based at least in part on an algorithm, the algorithm having inputs comprising the second store value of the variable.

8. The method of claim 7, wherein:
   the variable comprises two possible store values, each of the first plurality of store values and each of the second plurality of store values corresponding to one of the two possible store values;
   each of the n cells comprises q possible cell states, each of the n first cell values and each of the n second cell values corresponding to one of the q possible cell states; and
   for a given set of values of r, n, and q, the algorithm substantially maximizes a minimum number of times that the variable can be updated in the memory, under a constraint that, when updating the variable in the memory, each of the n cells of the memory either remains in its previous cell state or progresses to a cell state higher than its previous cell state.

9. The method of claim 7, wherein:
   the variable comprises two possible store values, each of the first plurality of store values and each of the second plurality of store values corresponding to one of the two possible store values;
   each of the n cells comprises q possible cell states, each of the n first cell values and each of the n second cell values corresponding to one of the q possible cell states; and
   the algorithm substantially allowing the variable to be updated in the memory at least a number of times comprising:

$[q/2^{r-1}]+r-2$ times;

$(q-1)(n-2r+1)+r-1$ times; or $(q-1)(n-2)+1$ times;

under a constraint that, when updating the variable in the memory, each of the n cells of the memory either remains in its previous cell state or progresses to a cell state higher than its previous cell state.

10. The method of claim 2, wherein the memory comprises a plurality of memory blocks, each of the memory blocks comprising a plurality of cells, a particular one of the memory blocks comprising at least a portion of the n cells, the method further comprising performing an operation to lower the state of each cell of the particular memory block to the lowest cell state.

11. The method of claim 10, wherein the operation to lower the state of each cell of the particular memory block to the lowest cell state is performed at some time after one or more of the plurality of variables can no longer be updated under a condition that each of the n cells of the memory either remains in its previous cell state or progresses to a higher cell state.

12. The method of claim 2, wherein each of the plurality of possible cell states is defined by a quantity of charge stored in one of the n cells of the memory.

13. The method of claim 2, further comprising detecting one or more cell values, each of the one or more detected cell values corresponding to a cell state of a particular one of the n cells of the memory.

14. The method of claim 2, each of the n cells of the memory having two possible cell states, each of the n first cell values and each of the n second cell values corresponding to one of the two possible cell states.

15. A method comprising:
    identifying n first cell values for storage in n cells of a memory, each of the n cells comprising a plurality of possible cell states sequentially ordered from a lowest cell state to a highest cell state; and writing the n first cell values to the n cells of the memory, each of the n first cell values corresponding to one of the plurality of possible cell states, the n first cell values jointly representing a first plurality of store values of k variables, the first plurality of store values comprising a first store value of each of the k variables and one or more previous store values of each of the k variables, at least one of the n first cell values comprising an individual cell value based at least in part on more than one of the store values.

16. The method of claim 15, further comprising:

writing n second cell values to the n cells of the memory, each of the n second cell values corresponding to one of the plurality of possible cell states, the n second cell values jointly representing a second plurality of store values, the second plurality of store values comprising a second store value of at least one of the k variables and the first store value of at the least one of the k variables, each of the n cells of the memory either remaining in its previous cell state or progressing to a cell state higher than its previous cell state.

17. An article comprising a computer-readable medium storing instructions operable to cause data processing apparatus to perform operations comprising:

receiving data for storage in a memory;

writing n first cell values comprising the received data to n cells of the memory, each of the n cells comprising a plurality of possible cell states sequentially ordered from a lowest cell state to a highest cell state, each of the n first cell values corresponding to one of the plurality of possible cell states, the n first cell values jointly representing a first plurality of store values of a variable, the first plurality of store values comprising a first store value of the variable and one or more previous store values of the variable, at least one of the n first cell values comprising an individual cell value based at least in part on more than one of the first plurality of store values.

18. The article of claim 17, the operations further comprising:

writing n second cell values to the n cells of the memory, each of the n second cell values corresponding to one of the plurality of possible cell states, each of the n cells of the memory either remaining in its previous cell state or progressing to a cell state higher than its previous cell state, the n second cell values representing a second plurality of store values of the variable, the second plurality of store values comprising a second store value and the first current store value.

19. The article of claim 18, the first plurality of store values and the second plurality of store values each comprising r store values, r comprising greater than one, the second plurality of store values comprising r−1 of the first plurality of store values.

20. The article of claim 19, wherein the n second cell values are determined based at least in part on an algorithm, the algorithm having inputs comprising the second store value of the variable.

21. The article of claim 20, wherein:

the variable comprises two possible store values, each of the first plurality of store values and each of the second plurality of store values corresponding to one of the two possible store values;

writing n second cell values to the n cells of the memory comprises updating the variable in the memory;

each of the n cells comprises q possible cell states, each of the n first cell values and each of the n second cell values corresponding to one of the q possible cell states; and for a given set of values of r, n, and q, the algorithm substantially maximizing a minimum number of times that the variable can be updated in the memory, under a constraint that, when updating the variable in the memory, each of the n cells of the memory either remains in its previous cell state or progresses to a cell state higher than its previous cell state.

22. A system comprising:

a memory comprising a plurality of cells, each of the plurality of cells comprising a plurality of possible cell states sequentially ordered from a lowest cell state to a highest cell state; and a processor adapted to write n first cell values to the n cells, each of the n first cell values corresponding to one of the plurality of possible cell states, the n first cell values jointly representing a first plurality of store values of a variable, the first plurality of store values comprising a first store value of the variable and one or more previous store values of the variable, at least one of the n first cell values comprising an individual cell value based at least in part on more than one of the first plurality of store values.

23. The system of claim 22, the memory comprising at least one of an optically encoded memory, a flash memory, a hard drive of a computer, a write asymmetric memory, or a write once memory.

24. The system of claim 22, the memory comprising a plurality of memory blocks, each of the memory blocks comprising its own plurality of cells.

* * * * *